United States Patent
Kim et al.

(10) Patent No.: US 9,406,447 B2
(45) Date of Patent: Aug. 2, 2016

(54) METHOD FOR PATTERNING MESOPOROUS INORGANIC OXIDE FILM, AND ELECTRIC DEVICE INCLUDING MESOPOROUS INORGANIC OXIDE FILM PATTERNED BY THE SAME

(71) Applicant: Industry-Academic Cooperation Foundation, Yonsei University, Seoul (KR)

(72) Inventors: Eun Kyoung Kim, Seoul (KR); Jong Hak Kim, Seoul (KR); Jeong Hun Kim, Seoul (KR); Jong Kwan Koh, Seoul (KR); Jong Beom Na, Seoul (KR); Chi Hyun Park, Suwon-si (KR)

(73) Assignee: INDUSTRY-ACADEMIC COOPERATION FOUNDATION, YONSEI UNIVERSITY (KR)

(*) Notice: Subject to any disclaimer, the term of this patent is extended or adjusted under 35 U.S.C. 154(b) by 472 days.

(21) Appl. No.: 13/935,469

(22) Filed: Jul. 3, 2013

(65) Prior Publication Data
US 2014/0007936 A1 Jan. 9, 2014

(30) Foreign Application Priority Data
Jul. 4, 2012 (KR) .................. 10-2012-0072844

(51) Int. Cl.
 H01L 21/31 (2006.01)
 H01G 9/20 (2006.01)
 H01L 29/78 (2006.01)
 H01G 9/00 (2006.01)
 H01L 51/05 (2006.01)

(52) U.S. Cl.
 CPC ........... *H01G 9/2022* (2013.01); *H01G 9/0029* (2013.01); *H01G 9/204* (2013.01); *H01G 9/2031* (2013.01); *H01L 29/78* (2013.01); *H01L 51/0508* (2013.01); *Y02E 10/542* (2013.01); *Y02P 70/521* (2015.11)

(58) Field of Classification Search
 None
 See application file for complete search history.

(56) References Cited

U.S. PATENT DOCUMENTS

| | | | | |
|---|---|---|---|---|
| 2011/0000542 A1* | 1/2011 | Yellasiri | ............ | H01L 31/02021 136/259 |
| 2014/0007936 A1* | 1/2014 | Kim | ............ | H01G 9/2022 136/256 |

FOREIGN PATENT DOCUMENTS

| | | |
|---|---|---|
| KR | 20070044981 A | 5/2007 |
| KR | 20100003690 A | 1/2010 |

* cited by examiner

*Primary Examiner* — Jack Chen

(57) ABSTRACT

Provided are a method for patterning a mesoporous inorganic oxide film, the method including a step of forming a mesoporous inorganic oxide film using a composition containing inorganic oxide particles; and a step of forming a pattern on the mesoporous inorganic oxide film using an elastic stamp for pattern formation, and then calcining the mesoporous inorganic oxide, and an electronic device including a mesoporous inorganic oxide film that has been patterned by the patterning method.

8 Claims, 7 Drawing Sheets

METHOD FOR PATTERNING MESOPOROUS INORGANIC OXIDE FILM, AND ELECTRIC DEVICE INCLUDING MESOPOROUS INORGANIC OXIDE FILM PATTERNED BY THE SAME

BACKGROUND OF THE INVENTION (a) Field of the Invention

The present invention relates to a method for patterning an inorganic oxide film, and an electronic device including a mesoporous inorganic oxide film patterned by the method.

(b) Description of the Related Art

Inorganic oxides having large band gaps are used in photoelectrodes, sensors, anode active materials for secondary batteries, semiconductor materials and the like, and particularly, patterned inorganic oxide films bring about an increase in the efficiency of photoelectrodes and a nanowire field effect, so that patterned inorganic oxide films are useful in nanowire field effect transistors (FET), triisopropylsilylethynyl pentacene (TIPS-PEN) thin film transistors, and the like (Jr. H. He et al., J. Phys. Chem. B, 2006, 110, 50-53; and Meredith J. Hampton et al., Adv. Mater. 2008, 20, 2667-2673). Even in the application of these inorganic oxide materials in solar cells, patterning is very important.

For most of organic solar cells, in order to increase the efficiency, research has been actively carried out to change the structure or to develop electrolytes, dyes, inorganic oxides, organic molecules, polymers, electrode materials and the like that can exhibit excellent efficiency. However, most of solar cells cannot effectively utilize a large amount of solar radiation due to the limitations on the structure and materials that constitute the solar cells, and make use of only a certain amount of light to convert the photo energy to electric energy, while transmitting or reflecting the rest of light. Therefore, current solar cells have limitations on exhibiting high efficiency.

For this reason, intense research has been in progress to find technologies which allow more sunlight to be collected from a fixed area and thereby increases the efficiency of solar cells, namely, light harvesting technologies. For instance, technologies for harvesting light in dye-sensitized solar cells through methods such as photonic crystals (Guldin, S. et al. Nano Lett. 10, 2303-2309 (2010); Mihi, A. et al. Angew. Chem. Int. Ed. 50, 5712-5715 (2011)), a plasmonic effect (Ding, I.-K. et al. Adv. Energy Mater. 1, 52-57 (2011)), formation of various nanostructures (Munday, J. N. et al. Nano Lett. 11, 2195-2201 (2011); Yang, L. et al. Adv. Mater. 23, 4559-4562 (2011)), and use of improved electrolytes (Wang, M. et al. Adv. Mater. 20, 5526-5530 (2010)). However, dye-sensitized solar cells that are produced by the aforementioned methods are produced by complicated production methods that include costly processes, and have a disadvantage that those solar cells cannot be readily applied to the processes for mass production, and are not applicable to various systems.

In this regard, as a method by which the efficiency of a solar cell can be effectively increased in a simpler way, a method of forming a nanostructured pattern on an electrode has been suggested. This method is a method of collecting sunlight using the properties of light such as diffraction and reflection by means of a regular nanopattern arrangement formed on an electrode, and this method has been applied to organic molecule junction type solar cells (Na, S.-I. et al. Adv. Funct. Mater. 18, 3956-3963 (2008)) and inorganic silicon solar cells (Battaglia, C. et al. Nature Photon. 5, 535-538 (2011)).

However, since the photoelectrode of a solar cell using an inorganic oxide, such as a dye-sensitized solar cell, is usually produced using a composite paste which contains nano-sized inorganicoxide fine particles together with a solvent and a binder, it has been not so easy to form a nanopattern.

Methods of wet processes including photolithography and etching, which are well known as methods for patterning inorganic materials, are associated with complicated processes and enormous costs, and it is not feasible to produce micro-sized or nano-sized patterns and to use them in mass production by using a patterning method using arrays, nanowires, nanotubes or the like (Jr H. He et al. J. Phys. Chem. B, 2006, 110, 50-53; and Meredith J. Hampton et al. Adv. Mater. 2008, 20, 2667-2673). Furthermore, in a method of performing patterning using an elastomer mold of polyurethane acrylate (PUA) or polydimethylsiloxane (PDMS) with a solution containing a precursor by a transfer mold (LB-nTM) method, or direct patterning technologies such as a micromolding patterning method utilizing the capillary phenomenon and a gravure printing method, since a solution phase is utilized, the solution must be solidified before being transferred to a substrate in order to prevent liquid diffusion, and because a product is obtained in a bulk form, it is difficult to produce a porous structure with a large surface area and satisfactory characteristics. Also, there are limitations on the substrate that can be processed, and the working efficiency is low.

Particularly, in order to form a pattern with an inorganic oxide film of $WO_3$, $V_2O_5$ or the like, or with an inorganic oxide that is utilized in photoelectrodes, such $TiO_2$ or ZnO, pattern production should be carried out while a mesoporous state is maintained. However, in patterns produced by the methods described above, since the difference in surface energy between the mold and the solution is so large that micropattern production at a nano-sized level is not easy. As a result, there are limitations on the increasing of the efficiency of photoelectrodes.

Furthermore, in a method of forming a pattern by depositing a metal reflecting layer and subjecting the layer to nanoimprinting, it is difficult to effectively produce surface asperities on the top surface in a large size, and there is a disadvantage that mass productivity is poor, and the process becomes more complicated. With regard to a method of patterning a photoelectrode using lithography, since expensive materials are used in large quantities, and expensive processes such as a light interference UV process and strict control thereof are required, the method is inefficient in mass production. Also, a method of forming a ZnO nanopattern on top of a transparent conducting oxide (TCO) layer has a disadvantage that the structure is incapable of energy conversion with high efficiency because the thickness of the part in the solar cell structure which absorbs light and converts the light to electricity is too small.

Furthermore, a method of forming a nanopattern by lithography using a $TiO_2$ precursor solution instead of nanoparticles has been suggested as a method for forming a pattern on a photoelectrode of a dye-sensitized solar cell. However, a photoelectrode that is formed by the method described above has a very small surface area and a small thickness, so that the photoelectrode exhibits an efficiency of 1% or less (H. Tokuhisa, P. T. Hammond, Adv. Funct. Mater. 2003, 13, 831-839.).

Recently, a technology of producing a nano-sized pattern by directly patterning a paste containing nanoparticles using a nanostamp formed of quartz has been suggested. However, it is difficult to produce quartz nanostamps, and since patterning is achieved under pressure, the nanostamps are susceptible to breakage and are not capable of producing regular pattern arrangements. Due to such problems, there has been suggested a method of coating the pattern with silver to utilize the plasmon phenomenon in connection with the method described above. However, this is not a technology that directly uses a nanostructure to harvest light, and since the technology involves coating of expensive silver through vacuum deposition, there are difficulties in putting the technology into commercial use (I.-K. Ding, et al., Adv. Energy Mater. 2011, 1, 52-57).

Therefore, there is a demand for the development of a photoelectrode which can utilize an effective light harvesting technology in order to increase the efficiency of solar cells, and there is a need to develop a technology capable of forming a nanopattern simply and effectively for the purpose of increasing the efficiency and enabling mass production. Also, there is an urgent demand for the development of a process for producing a photoelectrode for light harvesting, which can be applied to various dyes such as organic dyes as well as quantum dot dyes, and can be applied to solar cells which use various inorganic oxide particle pastes, electrolytes, electron and hole transfer materials and the like; and a process for patterning an inorganic oxide film for electronic devices.

REFERENCE DOCUMENTS

Patent Document 1: Korean Patent Application Publication No. 2010-0022859 (published on Mar. 3, 2010)
Patent document 2: Korean Patent No. 1116977 (registered on Feb. 8, 2012)
Patent Document 3: Korean Patent Application Publication No. 2012-0001456 (published on Jan. 4, 2012)
Non-patent document 1: Jr H. He et al. J. Phys. Chem. B, 2006, 110, 50-53
Meredith J. Hampton et al. Adv. Mater. 2008, 20, 2667-2673
Guldin, S. et al. Nano Lett. 10, 2303-2309 (2010)
Mihi, A. et al. Angew. Chem. Int. Ed. 50, 5712-5715 (2011)
Ding, I.-K. et al. Adv. Energy Mater. 1, 52-57 (2011)
Munday, J. N. et al. Nano Lett. 11, 2195-2201 (2011)
Yang, L. et al. Adv. Mater. 23, 4559-4562 (2011)
Wang, M. et al. Adv. Mater. 20, 5526-5530 (2010)
Na, S.-I. et al. Adv. Funct. Mater. 18, 3956-3963 (2008)
Battaglia, C. et al. Nature Photon. 5, 535-538 (2011)
H. Tokuhisa, P. T. Hammond, Adv. Funct. Mater. 2003, 13, 831-839
I.-K. Ding, et al., Adv. Energy Mater. 2011, 1, 52-57

SUMMARY OF THE INVENTION

An object of the present invention is to provide a method for patterning a mesoporous inorganic oxide film that is useful for the production of electronic devices, and particularly various large-sized solar cells, which method involves simple processes and low process cost, and is applicable to mass production processes.

Another object of the present invention is to provide a method for producing a photoelectrode, which can produce a regular nanopattern patterned by using the patterning method described above, and can improve the photoelectric conversion efficiency through an effective light harvesting technology, and to provide a solar cell including a photoelectrode that is produced by the production method described above.

Another object of the present invention is to provide a field effect transistor which includes a mesoporous inorganic oxide film that has been patterned by the patterning method described above.

In order to achieve the objects described above, according to an aspect of the present invention, there is provided a method for patterning a mesoporous inorganic oxide film, the method including a step of forming a mesoporous inorganic oxide film using a neutral composition containing inorganic oxide particles, and a step of forming a pattern on the mesoporous inorganic oxide film using an elastic stamp for pattern formation and then calcining the mesoporous inorganic oxide film.

The inorganic oxide may be an oxide containing a metal element selected from the group consisting of titanium (Ti), zinc (Zn), niobium (Nb), tungsten (W), zirconium (Zr), strontium (Sr), indium (In), lanthanum (La), vanadium (V), molybdenum (Mo), tin (Sn), magnesium (Mg), aluminum (Al), yttrium (Y), scandium (Sc), samarium (Sm), gallium (Ga), and combinations thereof.

The elastic stamp for pattern formation may be a stamp made of a material selected from the group consisting of polydimethylsiloxane, silicone rubber, polyethylene terephthalate, polycarbonate, polyimide, polyethylene, polymethyl methacrylate, polystyrene, polylactic-co-glycolic acid, hydrogel, and mixtures thereof.

The calcination process may be carried out at 200° C. to 450° C.

According to another aspect of the present invention, there is provided a method for producing a photoelectrode, the method including a step of forming a mesoporous inorganic oxide layer on a conductive substrate using a neutral mesoporous inorganic oxide particle-containing composition a pattern forming step of forming a pattern on the mesoporous inorganic oxide layer using an elastic stamp for pattern formation; a dye adsorption step of adsorbing a dye to the mesoporous inorganic oxide layer having a pattern formed thereon; and a hole transfer material injection step of injecting a hole transfer material into the mesoporous inorganic oxide layer having the dye adsorbed thereto.

The inorganic oxide may be an oxide containing a metal element selected from the group consisting of titanium (Ti), zinc (Zn), niobium (Nb), tungsten (W), zirconium (Zr), strontium (Sr), indium (In), lanthanum (La), vanadium (V), molybdenum (Mo), tin (Sn), magnesium (Mg), aluminum (Al), yttrium (Y), scandium (Sc), samarium (Sm), gallium (Ga), and combinations thereof.

The inorganic oxide particles may have a particle size of 2 nm to 60 μm.

The elastic stamp for pattern formation may be a stamp formed of a material selected from the group consisting of polydimethylsiloxane, silicone rubber, polyethylene terephthalate, polycarbonate, polyimide, polyethylene, polymethyl methacrylate, polystyrene, polylactic-co-glycolic acid, hydrogel, and mixtures thereof.

The production method described above may further include a step of forming an interface adhesive layer on the conductive substrate using a composition containing a precursor of the inorganic oxide, before the step of forming a meosporous inorganic oxide layer.

The pattern forming step may be carried out by forming a pattern on top of the mesoporous inorganic oxide layer using an elastic stamp for pattern formation, and then calcining the mesoporous inorganic oxide layer.

The hole transfer material injection step may be carried out by causing a composition containing a monomer of an electroconductive polymer for forming a hole transfer material, to penetrate into the patterned inorganic oxide layer, and then thermally polymerizing the composition to form an electroconductive polymer for forming a hole transfer material.

The production method may further include an additive injection step of injecting an additive containing a non-volatile ionic liquid and an ion salt, after the hole transfer material injection step.

According to still another aspect of the present invention, there is provided a solar cell including a photoelectrode produced by the method described above.

According to still another aspect of the present invention, there is provided a field effect transistor including a conductor layer; an insulator layer; and a semiconductor layer, the insulator layer including a mesoporous inorganic oxide film that has been patterned by the patterning method described above.

Specific matters of other embodiments of the present invention will be described in the following detailed description of the invention.

Advantageous Effects

The patterning method described above allows patterning of a mesoporous inorganic oxide film containing inorganic oxide particles in a simple and effective manner using a nanostamping method. Therefore, the patterning method can be usefully applied to the production of electronic devices that include mesoporous inorganic oxide films, for example, solar cells, field effect transistors, organic thin film transistors, and light emitting diodes.

Furthermore, a photoelectrode that has been patterned by using the patterning method described above can increase the photoelectric conversion efficiency of a solar cell through an effective light harvesting technology, and the method for producing the photoelectrode involves simple processes and low process cost, can be applied to mass production processes, and is useful for the production of large-sized solar cells.

DETAILED DESCRIPTION OF THE EMBODIMENTS

Figure 1:
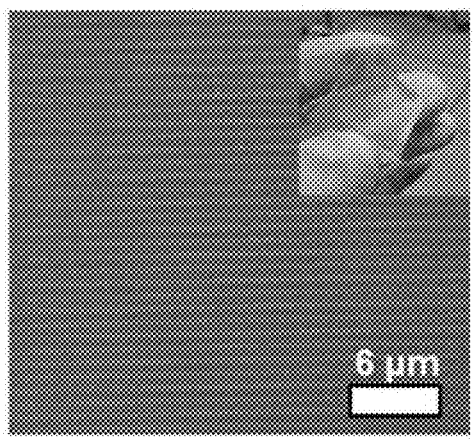
FIG. 1 is a scanning electron microscopic (SEM) photograph of the pattern of an elastic stamp for pattern formation that is used at the time of producing of the photoelectrode according to an embodiment of the present invention, and the diagram inserted therein is a photograph of the elastic stamp.

Hereinafter, embodiments of the present invention will be described in detail. However, the embodiments are only for illustrative purposes, and the present invention is not intended to be limited thereto. The present invention will be defined only by the scope of claims that will be described below.

Unless particularly stated otherwise in the present specification, the term "mesoporous" means porosity including the inorganic oxide nanoparticles and a space in which the nanoparticles are arranged at an arbitrary interval, that is, cavity channels that are formed between the nanoparticles. The arbitrary interval is referred to as a pore diameter.

Unless particularly stated otherwise herein, the term "solar cell" includes a dye-sensitized solar cell, an organic molecule junction type solar cell, an inorganic silicon solar cell, an all-solid-state thin film battery, a thin film silicon solar cell, and hybrids thereof. Hereinafter, the invention will be described based on a dye-sensitized solar cell, but the invention is not intended to be limited thereto.

The present invention is characterized in that a mesoporous inorganic oxide film is patterned in a simple and effective manner using an elastic nanostamping method.

That is, the method for patterning a mesoporous inorganic oxide film according to an embodiment of the present invention includes a step of forming a mesoporous inorganic oxide film using a neutral composition containing inorganic oxide particles (S11); and a step of forming a pattern on top of the mesoporous inorganic oxide film using an elastic stamp for pattern formation, and then calcining the mesoporous inorganic oxide film (S12).

Hereinafter, the various steps will be described in detail.

Step 1 is a step of forming a mesoporous inorganic oxide film using a neutral composition containing inorganic oxide particles.

The mesoporous inorganic oxide film can be formed by applying a composition containing inorganic oxide particles on a substrate.

At this time, the composition may be a sol or paste containing inorganic oxide particles. Regarding the paste, various pastes that are commercially available can be used, and home-made pastes can also be used.

The composition can contain various inorganic oxide particles. Specifically, inorganic oxides containing metals selected from the group consisting of titanium (Ti), zinc (Zn), niobium (Nb), tungsten (W), zirconium (Zr), strontium (Sr), indium (In), lanthanum (La), vanadium (V), molybdenum (Mo), tin (Sn), magnesium (Mg), aluminum (Al), yttrium (Y), scandium (Sc), samarium (Sm), gallium (Ga), and combinations thereof can be used, and in this case, the inorganic oxides also include composite metal oxides composed of combinations of the aforementioned metals and other metals. Specifically, it is preferable to use inorganic oxides such as $TiO_2$, $ZnO$, $SnO_2$, $WO_3$, $ZrO_2$, $Al_2O_3$, and $Y_2O_3$.

The inorganic oxides can form an oxide network of -M-O-M- (wherein M represents a metal selected from the group consisting of Ti, Zn, Nb, W and combinations thereof) within an inorganic oxide film. The inorganic oxide particles preferably have a particle size of 2 nm to 60 µm, and more preferably have a particle size of 2 nm to 1 µm. Furthermore, the composition used in the present invention is not intended to be limited to a composition containing inorganic oxide particles having a monodisperse size distribution, and inorganic oxide particles having two or more size distributions can be used in mixture.

In the case of forming a mesoporous inorganic oxide layer using inorganic oxide particles having a particle size in the range described above, the size of the pores in the inorganic oxide layer can be controlled to a meso-size range, and also, the adhesiveness between the substrate and the inorganic oxide layer and durability can be enhanced.

The composition is preferably neutral so that the composition does not cause a chemical reaction with the elastic stamp for pattern formation.

The method for applying the composition is not particularly limited, but examples thereof that can be used include a screen printing method, a spray coating method, a coating method using a doctor blade, a gravure coating method, a dip coating method, a silk screen method, a painting method, a coating method using a slit die, a spin coating method, a roll coating method, and a transfer coating method. Among these, it is preferable to use a doctor blade method in order to form a mesoporous film having a uniform thickness.

The inorganic oxide layer forming step may further include a multilayer coating step of an inorganic oxide particle-containing composition. In this case, the inorganic oxide particle-containing composition may be acidic, neutral or basic; however, the composition for forming a final inorganic oxide layer that will be brought into contact with the stamp for pattern formation is preferably neutral so that the composition does not cause a chemical reaction with the elastic stamp for pattern formation.

Step 2 is a step of forming a pattern on top of the mesoporous inorganic oxide film formed in Step 1 using an elastic stamp for pattern formation, and then calcining the mesoporous inorganic oxide film (S12).

More particularly, before the inorganic oxide layer produced in Step 2 dries up, the inorganic oxide layer is covered with an elastic stamp for pattern formation, maintained for a certain time, and then dried. Subsequently, the stamp for pattern formation is separated, and then the inorganic oxide layer is subjected to a calcination process at a high temperature. Thereby, a nanopattern can be formed on the surface of the inorganic oxide layer.

FIG. 1 is a photograph of the pattern of an elastic stamp for pattern formation that is used at the time of producing a photoelectrode according to an embodiment of the present invention, and the inserted diagram in FIG. 1 is a photograph of the elastic stamp for pattern formation.

Figure 2:
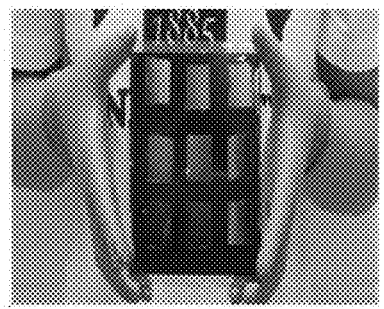
FIG. 2 is a photograph showing the results obtained by observing a multi-pattern cell formed on a large-sized substrate (20 cm×20 cm).

According to FIG. 1, the stamp that is used in the pattern forming step may be directly produced using a conventionally well known material based on a polymer having elasticity, such as polysiloxane or polyurethane, or may be produced by a method of replicating a pattern master that has been previously produced, and the stamp can be reused after being washed or cleaned by a simple process. As shown in FIG. 2, multiple cells may be produced on a single large substrate using a number of stamps, and as long as the size of the pattern master is large, the size of the stamp for pattern formation is not limited.

Regarding the stamp for pattern formation, stamps having regular patterns can be produced using various materials and used, and specifically, stamps made of materials selected from the group consisting of polydimethylsiloxane (PDMS), silicone rubber, polyethylene terephthalate (PET), polycarbonate (PC), polyimide (PI), polyethylene (PE), polymethylmethacrylate (PMMA), polystyrene (PS), polylactic-co-glycolic acid (PLGA), hydrogel, and mixtures thereof.

Furthermore, the stamp that is used in the pattern forming step may have a nano-sized or micro-sized pattern, and may have a pattern in which patterns of various shapes are arranged in a regular manner. Specifically, it is preferable that the stamp for pattern formation have a pattern formed at an interval of 0.1 nm to 1 mm.

The pattern forming step may be carried out at −20° C. to 200° C.

The pattern forming step may also include a multi-pattern forming step.

Subsequently, when it is confirmed that a pattern has been formed on the mesoporous inorganic oxide film, the stamp for pattern formation is separated and removed, and the patterned mesoporous inorganic oxide film is calcined.

The calcination step for the nanopattern is preferably carried out at 200° C. to 450° C. When the calcination process is carried out at a temperature in the range described above, the polymer material contained in the inorganic oxide layer and residue can be eliminated, and at the same time, crystallinity of the inorganic oxide is increased, so that a precise nanopattern can be formed.

The method for patterning a mesoporous inorganic oxide film such as described above can pattern a mesoporous inorganic oxide film containing inorganic oxide particles in a simple and effective manner using a nanostamping method. Accordingly, the patterning method can be usefully applied to the production of electronic devices including mesoporous inorganic oxide films, for example, solar cells, field effect transistors, organic thin film transistors, light emitting diodes, and the like.

The present invention also provides a method for producing a photoelectrode for light harvesting, which method can pattern a photoelectrode using an elastic nanostamping method, thereby enabling formation of a large-sized nanopattern in an effective and continuous manner through simple production processes, also enables increasing of the efficiency and mass production, can be applied to various dyes such as organic dyes as well as quantum dot dyes, and can be applied to various solar cells that use inorganic oxide particle-pastes, electrolytes, electron and hole transfer materials and the like. The present invention also provides a solar cell including a patterned photoelectrode that is produced by using the production method described above.

That is, the method for producing a photoelectrode according to another embodiment of the present invention includes a step of forming a mesoporous inorganic oxide layer using a neutral mesoporous inorganic oxide particle-containing composition; a pattern forming step of forming a pattern on the mesoporous inorganic oxide layer using an elastic stamp for pattern formation; a dye adsorption step of adsorbing a dye to the mesoporous inorganic oxide layer having a pattern formed thereon; and a hole transfer material injection step of injecting a hole transfer material into the mesoporous inorganic oxide layer having a dye adsorbed thereto.

Figure 3:
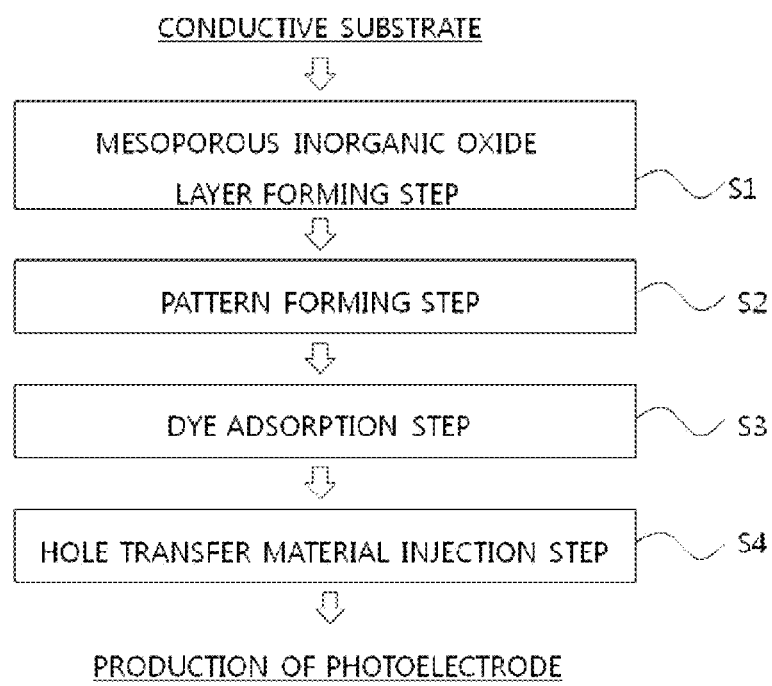
FIG. 3 is a process diagram schematically illustrating the step of producing photoelectrode according to an embodiment of the present invention.

FIG. 3 is a process diagram schematically illustrating the production process for a photoelectrode according to an embodiment of the present invention. Hereinafter, the method for producing a photoelectrode according to an embodiment of the present invention will be described in detail with reference to FIG. 3. However, FIG. 3 is only an example of the present invention, and the present invention is not intended to be limited thereto.

According to FIG. 3, the method for producing a photoelectrode according to an embodiment of the present invention includes a step of forming a mesoporous inorganic oxide layer (S1); a step of forming a pattern on the mesoporous inorganic oxide layer (S2); a step of adsorbing a dye (S3); and a step of injecting a hole transfer material (S4).

First, Step 1 is a mesoporous inorganic oxide layer forming step of forming a mesoporous inorganic oxide layer on a conductive substrate using a neutral mesoporous inorganic oxide-containing composition (S1).

The conductive substrate includes an electroconductive transparent electrode layer, and the electroconductive transparent electrode layer can be formed on a substrate.

The substrate is not particularly limited as long as it is a substrate that is conventionally used in solar cells. Specifically, a glass substrate, a silicon wafer, a metal-plated substrate, a plastic substrate or the like can be used, and the plastic substrate may be coated with various oxides and metals.

Regarding the plastic substrate, a substrate made of a material selected from the group consisting of poly(ethylene terephthalate), poly(ethylene naphthalate), polycarbonate, polypropylene, polyimide, triacetyl cellulose, polyethersulfone, copolymers thereof, and mixtures thereof, can be used.

The electroconductive transparent electrode layer is not particularly limited as long as it is an electrode layer that is conventionally used as an electroconductive transparent electrode. Specifically, the electrode layer may contain a material selected from the group consisting of indium tin oxide (ITO), fluorine tin oxide (FTO), $ZnO\text{—}Ga_2O_3$, $ZnO\text{—}Al_2O_3$, tin oxide, antimony tin oxide (ATO), zinc oxide, and mixtures thereof.

The method for forming a mesoporous inorganic oxide layer, and the inorganic oxide particle-containing composition have been explained above, and therefore, further descriptions will not be repeated here.

However, the inorganic oxide particle-containing composition is preferably a composition which does not cause a chemical reaction with the elastic stamp for pattern formation, and is neutral so that dye adsorption can be easily achieved.

For instance, in the case of patterning the acidic composition (Solaronix SA, D2O) using a PDMS stamp, the stamp surface changes to Si—OH in an acidic environment, and this is bonded to Ti—OH of $TiO_2$ particles so that after patterning, PDMS is torn off and adheres to the $TiO_2$ layer, or PMDS residue or the like penetrates into $TiO_2$. Thus, after patterning, during the calcination process at 450° C. or higher, PDMS changes into $SiO_2$, the surface turns hydrophobic, and the hydrophilic dye solution cannot penetrate thereinto. Thus, the dye cannot be adsorbed to the photoelectrode. However, in the case of a neutral paste which is incapable of a chemical surface reaction with a PDMS stamp, a $TiO_2$ layer having a hydrophilic surface is produced without the problems described above, and therefore, dye adsorption can be achieved.

Furthermore, the mesoporous inorganic oxide layer can be formed on the electroconductive transparent electrode to a desired thickness, and when the subsequent dye adsorption process, the amount of injection of a hole transfer material, and the like are taken into consideration, the mesoporous inorganic oxide layer is preferably formed to a thickness of 100 nm to 500 μm. When the mesoporous inorganic oxide layer is formed to a thickness in the range described above, the amount of dye adsorption increases, and the current density also increases. Then, an electroconductive polymer as the hole transfer material can sufficiently penetrate into the mesoporous inorganic oxide layer, and the hole transfer material can be distributed in a large surface area. Thus, the photoelectric conversion efficiency can be increased.

For the purpose of increasing the interface adhesive power between the electroconductive transparent electrode and the mesoporous inorganic oxide layer, an interface adhesive layer can be further formed.

The interface adhesive layer can be formed by applying a composition prepared by dissolving an inorganic oxide precursor in a solvent on an electroconductive transparent electrode, and then subjecting the composition to drying and calcination processes.

At this time, a substance capable of forming an inorganic oxide through a subsequent calcination process can be used as the inorganic oxide precursor, and specifically, a precursor substance such as titanium(IV) bis(ethylacetoacetato)diisopropoxide can be used, but the present invention is not limited to this.

As the solvent, alcohols such as butanol can be used.

The calcination process can be carried out at 200° C. to 450° C., and preferably a temperature of 400° C. or higher is suitable.

Step 2 is a pattern forming step of forming a pattern on the mesoporous inorganic oxide layer formed in Step 1, using an elastic stamp for pattern formation (S2).

More particularly, before the neutral inorganic oxide layer produced in Step 2 dries up, the inorganic oxide layer is covered with an elastic stamp for pattern formation, maintained for a certain time, and then dried. The stamp for pattern formation is separated, and then the inorganic oxide layer is subjected to a calcination process at a high temperature, and thus a nanopattern can be formed on the surface of the inorganic oxide layer.

The pattern forming step can be carried out by the same method as in Steps 2 and 3 of the patterning method for the mesoporous inorganic oxide film described above, and therefore, further description will not be repeated here.

Step 3 is a dye adsorption step of adsorbing a dye to the mesoporous inorganic oxide layer having a pattern forms thereon (S3).

At this time, the dye is not particularly limited as long as it is a dye usually used in solar cells. Specifically, a metal composite containing any one selected from the group consisting of aluminum (Al), platinum (Pt), palladium (Pd), europium (Eu), lead (Pb), iridium (Ir) and ruthenium (Ru) can be used, and an indoline dye or a quantum dot (QD) dye can also be used. Mixture of two or more of these dyes can also be used.

The dye adsorption process can be carried out by a conventional method such as an impregnation method of impregnating the patterned inorganic oxide layer in a dye-containing solution prepared by dissolving a dye in an alcohol-based solvent such as ethanol, and at this time, since the patterned mesoporous inorganic oxide layer produced in Step 2 contains uniform inorganic oxide particles, the dye can be more efficiently adsorbed.

Step 4 is a hole transfer material injection step of injecting a hole transfer material into the mesoporous inorganic oxide layer having a dye adsorbed thereto, which has been produced in Step 3 (S4).

Regarding the hole transfer material, liquid type electrolytes and solid type electrolytes can all be used, and any materials capable of transferring holes from an oxidation reduction reaction can all be used without particular limitations.

The hole transfer material injection step includes a procedure of causing the composition prepared by dissolving a hole transfer material in a solvent, to penetrate into the inorganic oxide layer having a dye adsorbed thereto. At this time, since the mesoporous inorganic oxide layer contains uniform inorganic oxide particles, injection of the hole transfer material is facilitated.

The hole transfer material is not particularly limited as long as it is usually used as a hole transfer material in solar cells.

The hole transfer material injection process can also be carried out by a method of causing a composition prepared by dissolving a monomer for forming a hole transfer material in a solvent, to penetrate into the patterned inorganic oxide layer, and then polymerizing the monomer through thermal polymerization to thereby forming a polymer for a hole transfer material.

Regarding the monomer for forming a hole transfer material, it is preferable to use a monomer of an electroconductive polymer, which can be polymerized into an electroconductive polymer in a solid state by thermal polymerization, has excellent electric conductivity, and can easily penetrate into the mesoporous thin film. Specifically, any one selected from the group consisting of 3,4-ethylenedioxythiophene (EDOT), 3,4-ethylenedioxyselenophene (EDOS), and a mixture thereof. In this case, synthesis in large quantities of electroconductive polymers in photoelectrodes can be carried out, while synthesis is simple and easy. Also, the hole transfer material has high conductivity while it is economically efficient. Therefore, economic mass production of solar cells can be achieved.

The composition containing a monomer for forming a hole transfer material can contain the monomer in an amount of 0.001% to 99.99% by weight, and preferably 1% to 60% by weight. If the concentration of the solution containing the monomer is less than 0.001% by weight, it is complicated to inject the solution many times, and effective polymerization cannot be achieved. If the concentration of the solution is greater than 99.99% by weight, it may be difficult for the monomer to effectively penetrate into the mesoporous thin film.

The amount of use of the composition containing the monomer for forming a hole transfer material can be appropriately determined in consideration of the type of the monomer, type of the solution, thickness of the photoelectrode layer, and the like.

As the solvent for the composition containing the monomer for forming a hole transfer material, a non-aqueous organic solvent selected from the group consisting of dichloromethane (MC), chloroform, acetonitrile, ethylene carbonate (EC), propylene carbonate (PC), butylenecarbonate, dimethylvinylene carbonate, vinylethylene carbonate, methyl ethyl carbonate (MEC), methyl propyl carbonate, methyl butyl carbonate, ethyl propyl carbonate, dimethyl carbonate (DMC), diethyl carbonate (DEC), dipropyl carbonate, dibutyl carbonate, methanol, ethanol, butanol, propanol, isopropyl alcohol, hexanol, heptanol, octanol, decanol, ethylene glycol, diethylene glycol, triethylene glycol, propylene glycol, pinacol, methyl propionate, methyl pivalate, butyl pivalate, hexyl pivalate, octyl pivalate, dimethyl oxalate, ethyl methyl oxalate, diethyl oxalate, tetrahydrofuran, 2-methyltetrahydrofuran, 1,4-dioxane, 1,2-dimethoxyethane, 1,2-diethoxyethane, 1,2-dibutoxyethane, dimethylformamide, trimethyl phosphate, tributyl phosphate, trioctyl phosphate, divinylsulfone, γ-butyrolactone, δ-valerolactone, α-angelicalactone, adiponitrile, 1,4-propanesultone, 1,4-butanediol dimethanesulfonate, propylene sulfite, glycol sulfate, propylene sulfate, dipropargyl sulfite, methylpropargyl sulfite, ethylpropargyl sulfite, propylene sulfite, glycol sulfate, propylene sulfate, toluene, hexane, xylene, acetone, and mixtures thereof can be used, and preferably, alcohols and glycols can be used.

The solvent can be removed before the step of thermally polymerizing the monomer for forming a hole transfer material, and can be preferably removed by evaporation.

The thermal polymerization process can be carried out at 20° C. to 200° C., and can be carried out at 50° C. to 100° C. If the thermal polymerization temperature is lower than 20° C., the time required for polymerization may become too long, and if the thermal polymerization temperature is higher than 200° C., polymerization may not occur, or an electroconductive polymer having low conductivity may be polymerized.

As described above, in the hole transfer material injection step involving thermal polymerization of a monomer for forming a hole transfer material, since the monomer is used in the form of a solution having the monomer in a solvent, the monomer can be made to effectively penetrate into the spaces between the particles in the inorganic oxide layer to which a dye has adsorbed, and thereafter, the hole transfer material is simply polymerized by heat so as to distribute the hole transfer material in a large area within the inorganic oxide layer. As a result, high conductivity can be obtained.

After the hole transfer material injection step, an additive injection step of injecting an additive containing a non-volatile ionic liquid and an ion salt may be further included.

The additive may be a mixture of a non-volatile ionic liquid and an ion salt, and the anion of the ionic liquid and the ion salt may be different in terms of form and size.

As the non-volatile ionic liquid, an ionic liquid selected from the group consisting of 1-methyl-3-propylimidazoliumiodide (MPH), 1-ethyl-3-methylimidazolium dicyanamide, 1-butyl-3-methylimidazolium chloride, 1-butyl-3-methylimidazolium tetrafluoroborate, 1-butyl-3-methylimidazolium hexafluorophosphate, 1-butyl-3-methylimidazolium bis(trifluoromethanesulfonyl)imide, 1-butyl-3-methylimidazolium trifluoromethanesulfonate, 1-butyl-3-methylimidazolium trifluoroacetate, 1-butyl-3-methylimidazolium dicyanamide, 1-butyl-3-methylimidazolium thiocyanate, 1-butyl-3-methylimidazolium salt, 1-butyl-3-methylimidazolium tetrachloroferrate, 4-tert-butylpyridine, saccharin, and mixtures thereof can be preferably used, and among these, it is preferable to use 4-tert-butylpyridine in view of the effect of improving the photoelectric conversion efficiency.

Furthermore, as the ion salt, a salt selected from the group consisting of an ammonium salt, a sodium salt, a lithium salt and mixtures thereof can be used.

The ammonium salt may be any one selected from the group consisting of n-$Bu_4NClO_4$, n-$Bu_4NPF_6$, n-$Bu_4NBF_4$, n-$Et_4NClO_4$, and mixtures thereof, and the sodium salt may be any one selected from the group consisting of $NaPF_6$, $NaBF_4$, $NaClO_4$ and mixtures thereof. The lithium may be any one selected from the group consisting of $LiClO_4$, $LiPF_6$, $LiBF_4$, $LiN(SO_2CF_3)_2$, $LiN(SO_2C_2F_5)_2$, $LiCF_3SO_3$, $LiC(SO_2CF_3)_3$, $LiPF_4(CF_3)_2$, $LiPF_3(C_2F_5)_3$, $LiPF_3(CF_3)_3$, $LiPF_3(iso-C_3F_7)_3$, $LiPF_5(iso-C_3F_7)$, $(CF_2)_2(SO_2)_2NLi$, $(CF_2)_3(SO_2)_2NLi$, and mixtures thereof. These salts may have the hydrogen atoms substituted by linear alkyl groups.

Preferably, the ion salt may be any one selected from the group consisting of n-$Bu_4NClO_4$, n-$Bu_4NPF_6$, n-$Bu_4NBF_4$, $NaClO_4$, n-$Et_4NClO_4$, $LiClO_4$, $LiN(SO_2CF_3)_2$, $LiN(SO_2C_2F_5)_2$, $LiCF_3SO_3$, $LiC(SO_2CF_3)_3$, $LiPF_4(CF_3)_2$, $LiPF_3(C_2F_5)_3$, $LiPF_3(CF_3)_3$, $LiPF_3(iso-C_3F_7)_3$, $LiPF_5(iso-C_3F_7)$, and mixtures thereof, and these ion salts can increase the amount of current by being additionally doped into an electroconductive polymer.

The ion salt can be used in an amount of 1:0.0000001 to 1:200 as a molar ratio with respect to the non-volatile ionic liquid.

A photoelectrode produced by the production method as described above can be used to harvest light effectively, and thus can exhibit increased photoelectric conversion efficiency.

Therefore, according to another embodiment of the present invention, there is provided a solar cell including a photoelectrode produced by the production method described above.

Specifically, the solar cell can be produced by superimposing a counter electrode with the photoelectrode, and sealing the assembly while pressing. However, any method for producing a solar cell can be applied without limitations.

The counter electrode is a substrate having a conductive layer containing a material selected from the group consisting of indium tin oxide (ITO), fluorine tin oxide (FTO), ZnO—Ga$_2$O$_3$, ZnO—Al$_2$O$_3$, tin oxide, antimony tin oxide (ATO), zinc oxide and combinations thereof, and the substrate may be a glass substrate or a plastic substrate.

The explanation on the substrate is the same as the explanation for the substrate used in the production of the photoelectrode of the present invention, and therefore, further description will not be repeated.

A solar cell including the photoelectrode may be a dye-sensitized solar cell, an organic molecule junction type solar cell, an inorganic silicon solar cell, an all-solid-state thin film battery, a thin film silicon solar cell, or a hybrid thereof, and the solar cell is preferably a dye-sensitized solar cell.

The method for producing the photoelectrode can extend the light transmission path using the reflection of incident sunlight and the diffraction phenomenon, by simply forming a regular nanopattern on a mesoporous inorganic oxide layer using a stamp for nanopattern formation, and as a result, more light can be utilized in photoelectric conversion. Thus, the problem of conventional solar cells that light cannot be effectively absorbed can be solved, and the efficiency of solar cells can be increased. Also, the production method described above conveniently improves the conventional production method that is complicated in terms of the light harvesting technology of solar cells, has high stability, enables mass production, and is useful for the production of large-sized solar cells. Also, the stamp for pattern formation can be reused, and the process cost can be lowered.

According to another embodiment of the present invention, there is provided a field effect transistor which includes a mesoporous inorganic oxide film that has been patterned by the patterning method.

Specifically, the field effect transistor includes a conductor layer, an insulator layer and a semiconductor layer, and the insulator layer includes a mesoporous inorganic oxide film that has been patterned by the patterning method described above.

The field effect transistor can be produced according to a conventional method for producing a field effect transistor except that the mesoporous inorganic oxide film included in the insulator layer is patterned by the patterning method described above, and therefore, further description will not be repeated here. Hereinafter, Examples of the present invention will be described in detail so that those having ordinary skill in the art to which the present invention is pertained can easily carry out the present invention. However, the present invention can be embodied in various different forms, and the present invention is not intended to be limited to the Examples described here.

EXAMPLE 1-1

A ZnO paste solution (a ZnO sol having an average particle size of 20 nm to 30 nm) containing polyethylene glycol and ZnO nanoparticles (Finex 30, Sakai Chemical Industry, Japan) was drop cast on an FTO substrate having a size of 3.0 cm×3.0 cm, and then the ZnO paste solution was applied with a doctor blade. The applied solution was dried in an oven at 50° C. for about 30 minutes, and then was calcined at 450° C. Thus, a porous zinc oxide thin film having a large surface area was produced. A neutral ZnO paste solution was drop cast on the zincoxide thin film thus produced, and then the ZnO paste solution was applied thereon with a doctor blade. A PDMS nanopattern stamp (500 nm period) was superimposed on the coated ZnO paste, subsequently air bubbles were removed, and the ZnO paste was dried at normal temperature for 12 hours. After being dried, the nanopattern stamp was removed, and the ZnO paste was calcined at 450° C. to remove the residue and the polymer material contained in the paste. Thus, a patterned porous zinc oxide thin film having a large surface area was produced.

EXAMPLE 1-2

The pattern forming process for a mesoporous inorganic oxide layer was carried out according to the production process as described below.

Specifically, a titanium bis(ethylacetoacetato)diisopropoxide solution (included in butanol in an amount of 2% by weight) was spin coated at 2000 rpm on a fluorine doped tin oxide (FTO) glass substrate having a size of 3.0 cm×3.0 cm, and then the solution was calcined at 450° C. for 30 minutes. Thus, an interface adhesive layer for increasing the adhesiveness between the TiO$_2$ paste and the FTO glass was formed. An acidic TiO$_2$ paste (Ti-Nanoxide D2O, manufactured by Solaronix SA) was drop cast on the interface adhesive layer, and then the paste was applied with a doctor blade. Drying processes were carried out in an oven at 50° C. for 30 minutes and at normal temperature for 24 hours, respectively, and then anatase crystallinity was increased while the paste was calcined at 450° C. to remove the residue and the polymer material contained in the paste. Thus, a mesoporous titanium dioxide thin film having a thickness of 10 μm was produced.

A neutral TiO$_2$ paste (18NR-T, manufactured by Dyesol, Ltd.) was drop cast on the titanium dioxide thin film, and then the paste was applied with a doctor blade. A polydimethylsiloxane (PDMS) nanopattern stamp (600 nm period) was superimposed on the TiO$_2$ paste, subsequently air bubbles were removed, and the TiO$_2$ paste was dried at normal temperature for 12 hours. After being dried, the nanopattern stamp was removed, and the TiO$_2$ paste was calcined at 450° C. to increase anatase crystallinity while the residue and the polymer material contained in the paste were removed. Thus, a patterned porous titanium dioxide layer was produced.

The patterned porous titanium dioxide layer was observed with a scanning electron microscope. The results are presented in FIG. 4A to FIG. 4C.

Figure 4A:
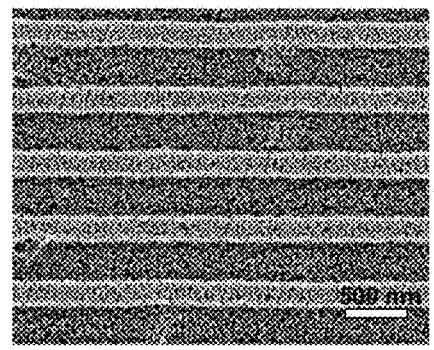
FIG. 4A is a scanning electron microscopic (SEM) observation photograph of the mesoporous titanium dioxide layer patterned in Example 1.
Figure 4B:
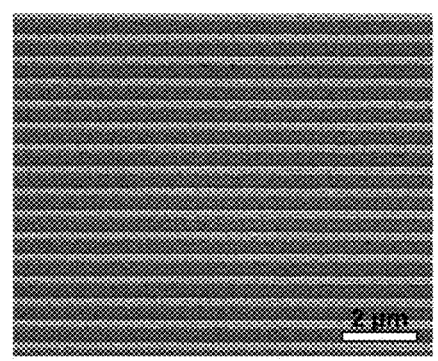
FIG. 4B is a magnified SEM observation photograph of FIG. 4A.

FIG. 4A is a scanning electron microscopic (SEM) observation photograph of the porous titanium dioxide layer patterned in Example 1; FIG. 4B is a magnified SEM photograph of FIG. 4A; and FIG. 4C is a SEM observation photograph of a cross-section of the porous titanium dioxide layer.

Figure 4C:
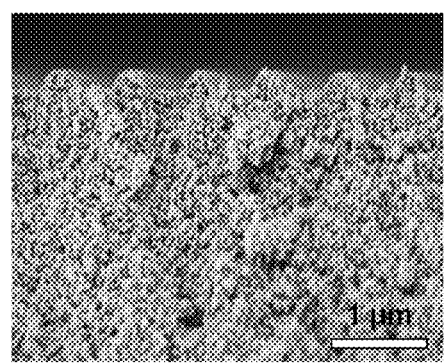
FIG. 4C is a SEM observation photograph of a cross-section of the mesoporous titanium dioxide layer.

It was confirmed from the scanning electron microscopic (SEM) observation photographs presented in FIG. 4A to FIG. 4C that a uniform nano-sized pattern was produced in a regular fashion.

In order to adsorb a dye to the patterned porous titanium dioxide thin film produced as described above, the patterned porous titanium dioxide thin film was impregnated with a 0.02 wt % dye-containing solution prepared by dissolving a ruthenium-based dye (N719, manufactured by Solaronix SA) in ethanol. The impregnation process was carried out for 3 hours or longer at 50 C. The color of the dye-adsorbed titanium dioxide layer was the same as the color of the adsorbed dye.

EXAMPLE 1-3

A ZnO paste solution was drop cast on a fluorine-doped tin oxide (FTO) substrate having a size of 5.0 cm×5.0 cm, and then the ZnO paste solution was applied with a doctor blade. A polyurethane nanopattern stamp (400 nm period) was superimposed on the ZnO paste, subsequently air bubbles were removed, and the ZnO paste was dried at normal temperature for 12 hours. After being dried, the nanopattern stamp was removed, and the ZnO paste was calcined at 450° C. Thus, a patterned zinc oxide thin film was produced.

In order to adsorb a dye to the patterned zinc oxide thin film, the patterned zinc oxide thin film was impregnated with a 0.05 wt % dye-containing solution prepared by dissolving a ruthenium-based dye (N719, Solaronix SA) in ethanol. The impregnation process was carried out for 5 hours or longer at 40 C.

COMPARATIVE EXAMPLE 1-1

A titanium bis(ethylacetoacetato)diisopropoxide solution (contained in butanol in an amount of 2 wt %) was spin coated at 4000 rpm on an FTO glass substrate having a size of 3.0 cm×5.0 cm, and then the solution was calcined for 30 minutes at 450° C. Thus, an interface adhesive layer for increasing the adhesiveness between the $TiO_2$ paste and the FTO glass was formed. A $TiO_2$ paste ($TiO_2$ sol having a particle size of 20 nm to 30 nm) was drop cast on the interface adhesive layer, and then the paste was applied with a doctor blade. The paste was dried in an oven at 50° C. for 40 minutes, and then anatase crystallinity was increased while the paste was calcined at 450° C. to remove the residue and the polymer material contained in the paste. Thus, a mesoporous titanium dioxide thin film having a thickness of 5 μm was produced.

In order to adsorb a dye to the porous titanium dioxide thin film described above, the porous titanium dioxide thin film was impregnated with a 0.025 wt % dye-containing solution prepared by dissolving a ruthenium-based dye (N719, manufactured by Solaronix SA) in ethanol. The impregnation process was carried out for 3 hours or longer at 50° C.

COMPARATIVE EXAMPLE 1-2

A titanium bis(ethylacetoacetate) solution (contained in butanol in an amount of 2 wt %) was spin coated at 2000 rpm on a fluorine-doped tin oxide (FTO) glass substrate having a size of 3.0 cm×3.0 cm, and then the solution was calcined for 30 minutes at 450° C. Thus, an interface adhesive layer for increasing the adhesiveness between the $TiO_2$ paste and the FTO glass was formed. An acidic $TiO_2$ paste (Ti-Nanoxide D20, manufactured by Solaronix SA) was drop cast on the interface adhesive layer, and then the paste was applied with a doctor blade. A PDMS nanopattern stamp (600 nm period) was superimposed on the $TiO_2$ paste, subsequently air bubbles were removed, and the ZnO paste was dried at normal temperature for 12 hours. After being dried, the nanopattern stamp was removed, and then anatase crystallinity was increased while the paste was calcined at 450° C. to remove the residue and the polymer material contained in the paste. Thus, a patterned mesoporous titanium dioxide thin film was produced.

TEST EXAMPLE 1

For the patterned mesoporous titanium dioxide layers produced in the photoelectrode production process in Example 1-1 and Comparative Example 1-2, the presence or absence of hydrophilicity and the presence or absence of dye adsorption were evaluated. The results are presented in FIG. 6 and FIG. 7, respectively.

Figure 5A:
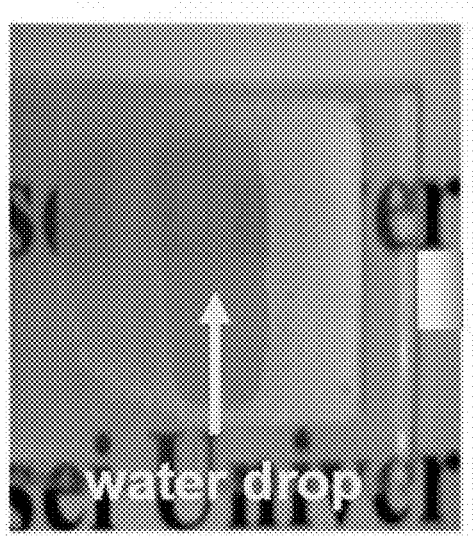
FIG. 5A is a photograph obtained by observing the results of a hydrophilicity experiment performed on a mesoporous titanium dioxide layer that has been patterned with a neutral paste at the time of photoelectrode production according to Example 1-1.
Figure 5B:
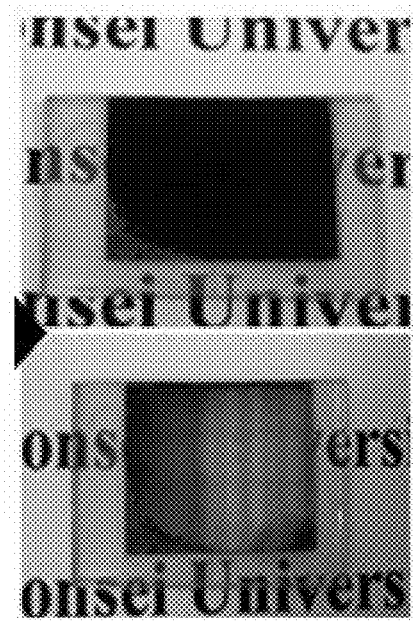
FIG. 5B is a photograph obtained by observing the results of dye adsorption to the mesoporous titanium dioxide layer that has been patterned.

FIG. 5A is a photograph obtained by observing the hydrophilicity test results for the mesoporous titanium dioxide layer patterned with a neutral paste at the time of producing a photoelectrode according to Example 1-1, and FIG. 5B is a photograph obtained by observing the dye adsorption results for the patterned mesoporous titanium dioxide layer described above. Furthermore, FIG. 6A is a photograph obtained by observing the hydrophilicity test results for the mesoporous titanium dioxide layer patterned with an acidic paste at the time of producing a photoelectrode according to Comparative Example 2-1, and FIG. 6B is a photograph obtained by observing the dye adsorption results for the patterned mesoporous titanium dioxide layer described above.

Figure 6A:
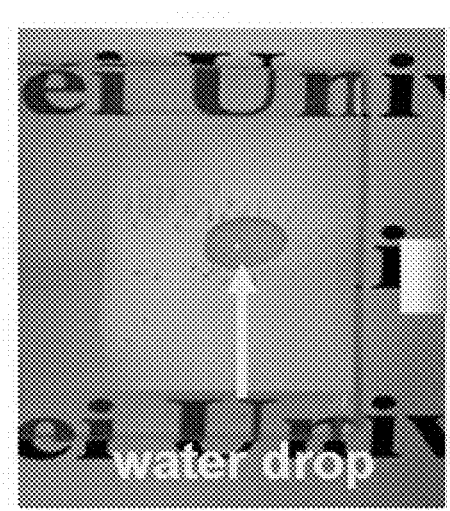
FIG. 6A is a photograph obtained by observing the results of a hydrophilicity experiment performed on a mesoporous titanium dioxide layer that has been patterned using an acidic paste at the time of photoelectrode production according to Comparative Example 1-2.
Figure 6B:
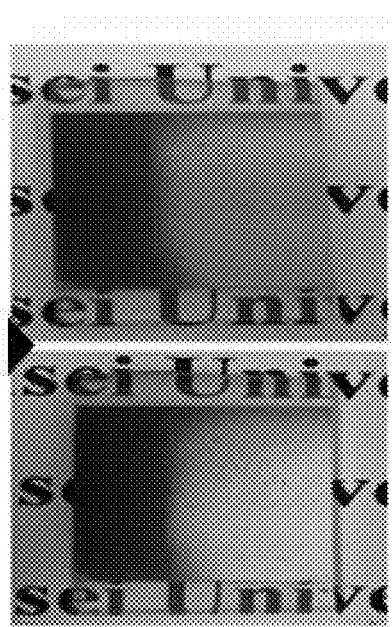
FIG. 6B is a photograph obtained by observing the results of dye adsorption to the mesoporous titanium dioxide layer that has been patterned.

As shown in FIG. 5A and FIG. 6A, the patterned mesoporous titanium dioxide layer produced by using a neutral paste in Example 1-1 exhibited hydrophilicity, and the patterned mesoporous titanium dioxide layer produced by using an acidic paste in Comparative Example 1-2 exhibited hydrophobicity.

Furthermore, when a dye adsorption test for the patterned mesoporous titanium dioxide layers was performed, in the patterned mesoporous titanium dioxide layer produced in Example 1-1, the dye was adsorbed uniformly over the entire titanium dioxide layer. On the other hand, in the patterned mesoporous titanium dioxide layer produced in Comparative Example 2-1, despite the fact that patterning was achieved satisfactorily, the dye was not adsorbed due to the hydrophobicity of the patterned mesoporous titanium dioxide thin film surface. From these results, it can be seen that a solar cell cannot be produced using a patterned inorganic oxide layer produced by using a $TiO_2$ nanoparticle-containing acidic paste.

EXAMPLE 2-1

Production of Solar Cell

In the photoelectrode produced in Example 1-2, 2,5-dibromo-3,4-ethylenedioxythiophene (DBEDOT) which is a monomer of an electroconductive polymer capable of solid-state polymerization was allowed to penetrate therein, and the monomer was thermally polymerized to form a hole transfer material within the $TiO_2$ inorganic oxide layer (Korean Patent No. 1073118; and Jong Kwan Koh et al. Advanced Materials, 23, 1641-1646, (2011)). On the inorganic oxide layer in which the hole forming material had been injected, an electrolyte containing 1-methyl-3-propylimidazolium iodide (MPII) and 4-tert-butylpyridine as non-volatile ionic liquids, and lithium bis(trifluoromethanesulfonyl)imide (LiTFSI) as an ion salt was cast.

An electroconductive glass coated with platinum (Pt) as a counter electrode was arranged to face the photoelectrode on which an electrolyte had been cast, and the assembly was pressed so that the electrolyte layer would firmly adhere to the surfaces of the two electrodes. The assembly was sealed with an epoxy bonding agent, and thus a solar cell (A) was produced.

EXAMPLE 2-2

Production of Solar Cell

An injection port was produced on the conductive glass coated with platinum (Pt) as a counter electrode, using a drill so that an ionic liquid as an electrolyte could be filled therethrough. Subsequently, the photoelectrode produced in Example 2-1 and an adhesive thin film were bonded together, with a gap left therebetween, and an ionic liquid as an electrolyte composed of 1,2-dimethyl-3-propylimidazolium iodide (DMPII), lithium iodide (LiI), and 4-tert-butylpyridine (TBP) was filled in the gap through the injection port of the counter electrode. In order to prevent the ionic liquid from vaporizing, the injection port was sealed with an adhesive thin film, and thus a liquid electrolyte solar cell (B) was produced.

EXAMPLE 2-3

Production of Solar Cell

A substrate in which a pattern had been formed on a titanium dioxide thin film layer was impregnated with a 0.02 wt % dye-containing solution prepared by dissolving a ruthenium-based dye (N3, manufactured by Solaronix SA), and thereby the dye was adsorbed. Thus, a photoelectrode was produced. At this time, the impregnation process was carried out for 3 hours or longer at 50° C.

A liquid electrolyte solar cell (C) was produced in the same manner as in Example 2-2, except that the photoelectrode produced as described above was used.

EXAMPLE 2-4

Production of Solar Cell

A photoelectrode was produced in the same manner as in Example 1-1, except that a photoelectrode that had been patterned by using a PDMS nanopattern stamp (800 nm period) during the patterning process, was used.

A liquid electrolyte solar cell (D) was produced in the same manner as in Example 2-2, using the photoelectrode produced as described above.

EXAMPLE 2-5

Production of Solar Cell

A solar cell (E) was produced in the same manner as in Example 2-1, except that the electrolyte contained a hole transfer material prepared by allowing 2,5-dibromo-3,4-ethylenedithiathiophene (DBEDTT) which is a monomer of an electroconductive polymer capable of solid-state polymerization, to penetrate and polymerize [Jeonghun Kim et al. Advanced Functional Materials, 21, 4633-4639, (2011)].

COMPARATIVE EXAMPLE 2-1

Production of Solar Cell

A solar cell (E) was produced in the same manner as in Example 2-1, except that the $TiO_2$ photoelectrode of Comparative Example 1-1 on which no pattern was formed was used.

COMPARATIVE EXAMPLE 2-2

Production of Solar Cell

A solar cell (G) was produced in the same manner as in Example 2-2, except that the $TiO_2$ photoelectrode of Comparative Example 1-1 on which no pattern was formed was used.

TEST EXAMPLE 2

Properties Evaluation of Solar Cells 2-1. Measurement of Reflectance

The reflectance of a photoelectrode having a nanopattern was measured using a UV/Vis/NIR spectrometer (Spectralon™) equipped with a coated integrating sphere (diameter: 60 mm), and using $BaSO_4$ as a reference material (PerkinElmer, Inc., Model: Lambda 750, USA). The results are presented in FIG. 7.

Figure 7:
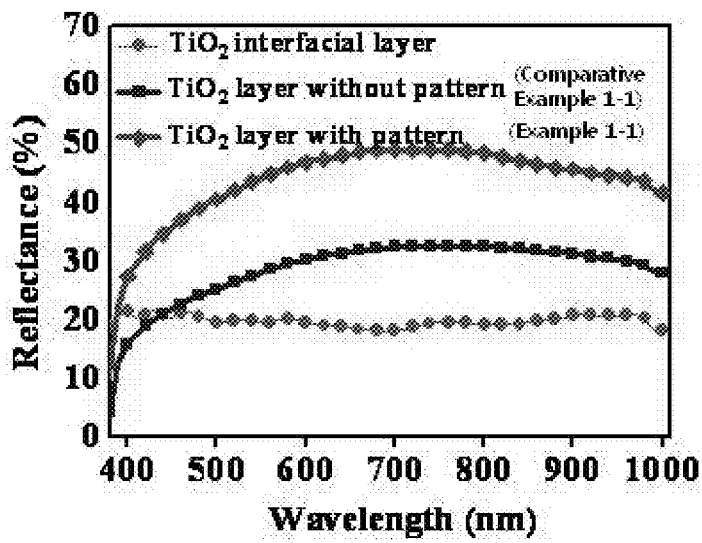
FIG. 7 is a graph illustrating the results of measuring the reflectances of the $TiO_2$ interface layer and the patterned inorganic oxide layer at the time of photoelectrode production according to Example 1, and the reflectance of a non-patterned inorganic oxide layer in Comparative Example 1.

FIG. 7 is a graph showing the reflectance measurement results for the $TiO_2$ interface adhesive layer (Reference Example) and the patterned inorganic oxide layer at the time of producing a photoelectrode according to Example 1-1, and the non-patterned inorganic oxide layer of Comparative Example 1-1.

As shown in FIG. 7, the inorganic oxide layer having a pattern formed thereon exhibited markedly high reflectance in all light regions as compared with the inorganic oxide layer on which no pattern was formed. Furthermore, as the inorganic oxide layer acquired such high reflection characteristics, light that had not been absorbed was not transmitted but re-entered the photoelectrode layer. Therefore, the light path was lengthened, and more light could be harvested.

2-2. Efficiency Analysis of Solar Cells

The performance of the solar cells produced as described above was evaluated. The results are presented in the following Table 1, as well as in FIG. 8A, FIG. 8B, and FIG. 9.

Figure 8A:
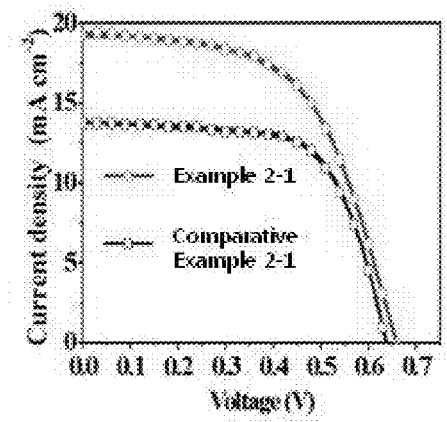
FIG. 8A is a current-voltage curve (I-V curve) the solar cells (A and F) according to Example 2-1 and Comparative Example 2-1.
Figure 8B:
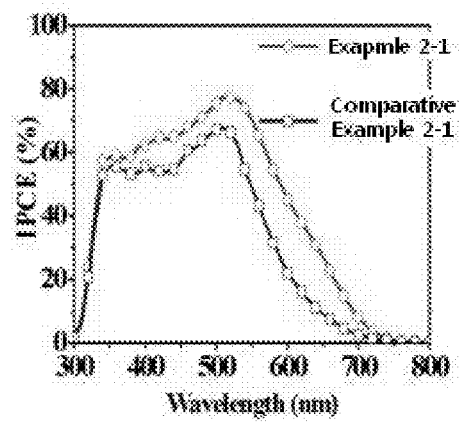
FIG. 8B is a graph illustrating the results of measuring the photoelectric conversion efficiency in the solar cells.
Figure 9:
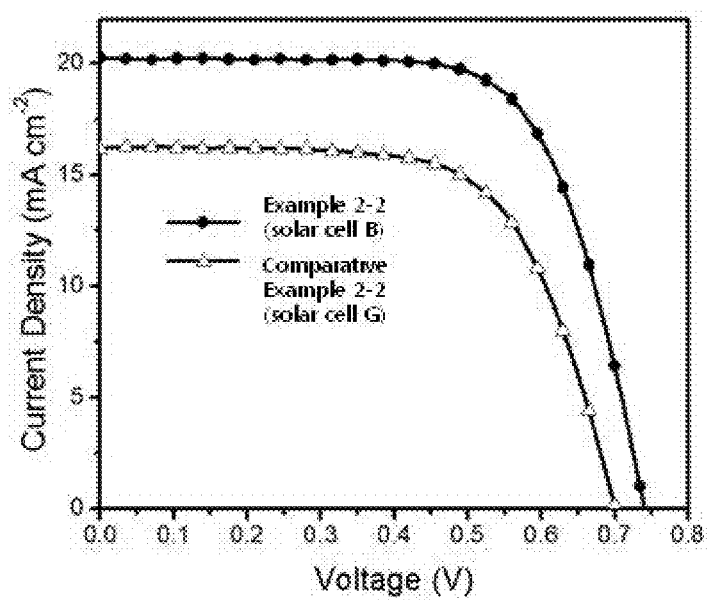
FIG. 9 is a current-voltage curve (I-V curve) of the solar cells (B and G) according to Example 2-2 and Comparative Example 2-2.

FIG. 8A is a current-voltage curve (I-V curve) of the solar cells (A and F) according to Example 2-1 and Comparative Example 2-1, and FIG. 8B is a graph showing the results of the measurement of photoelectric conversion efficiency in those solarcells. FIG. 9 is a current-voltage curve (I-V curve) of the solar cells (B and G) according to Example 2-2 and Comparative Example 2-2.

|  | Solar cell No. | Pin (mW/cm$^2$) | $V_{oc}$ (V) | $J_{sc}$ (mA/cm$^2$) | $V_{oc} * J_{sc}$ (mW/cm$^2$) | $V_{max} * J_{max}$ (mW/cm$^2$) | FF | Efficiency (%) |
|---|---|---|---|---|---|---|---|---|
| Example 2-1 | A | 100 | 0.654 | 19.2 | 12.5568 | 7.02 | 0.56 | 7.02 |
| Example 2-2 | B | 100 | 0.739 | 20.5 | 15.1536 | 9.939 | 0.6522 | 9.88 |
| Example 2-3 | C | 100 | 0.727 | 18.7 | 13.6094 | 9.474 | 0.6537 | 9.14 |

-continued

| Solar cell No. | | Pin (mW/cm$^2$) | $V_{oc}$ (V) | $J_{sc}$ (mA/cm$^2$) | $V_{oc} * J_{sc}$ (mW/cm$^2$) | $V_{max} * J_{max}$ (mW/cm$^2$) | FF | Efficiency (%) |
|---|---|---|---|---|---|---|---|---|
| Example 2-4 | D | 100 | 0.642 | 18.4 | 11.8123 | 6.83 | 0.57 | 6.72 |
| Example 2-5 | E | 100 | 0.651 | 11.2 | 7.2912 | 4.226 | 0.56 | 4.18 |
| Comp. Ex. 2-1 | F | 100 | 0.639 | 13.8 | 8.8182 | 5.29 | 0.60 | 5.29 |
| Comp. Ex. 2-2 | G | 100 | 0.695 | 16.3 | 11.3285 | 6.081 | 0.6423 | 7.29 | a dye-sensitized solar cell in which a conventional titanium dioxide thin film issued as a photoelectrode, an electroconductive polymer is used as a hole transfer material, and a ruthenium-based dye is used, without any iodine added thereto, the photoelectric conversion efficiency is reported to be 0.8% to 3.0% [J. Phys. Chem. B 2004, 108, 18693; J. Chem. Mater. 2006, 18, 4215; Adv. Mater. 2006, 18, 2579; Chem. Lett. 1997, 26,471; and J. AM. CHEM. SOC. 2008, 130, 1258)]. However, as shown in Table 1, FIG. 8A and FIG. 8B, it was confirmed that the efficiency values of the solar cell A and the solar cell F of Examples were markedly high, such as about 7.02% and about 5.29%, as compared with other solar cells which have been reported to give an efficiency value of 3% by using existing electroconductive polymers. Furthermore, the solar cell A having a nanopattern introduced therein exhibited improved performance as compared with the solar cell F that did not have a nanopattern, and this was not limited to solid hole transfer materials. Between the solar cells B and G that used liquid electrolytes as shown in FIG. 9, the solar cell B having a nanopattern introduced therein exhibited an efficiency value of 9.88%, which was higher than the efficiency value of 7.29% of the solar cell G, due to effective light harvesting.

EXAMPLE 3

Production of Field Effect Transistor

A titanium bis(ethyl acetoacetate) solution (contained in an amount of 2 wt % in butanol) was spin coated at 2000 rpm on an FTO glass substrate having a size of 3.0 cm×3.0 cm, and then the solution was calcined for 30 minutes at 450° C. Thus, an interface adhesive layer for enhancing the adhesiveness between the TiO$_2$ paste and the FTO glass was formed. A neutral TiO$_2$ paste (18NR-T, manufactured by Dyesol, Ltd.) was drop cast on the interface adhesive layer, and then the paste was applied with a doctor blade. A PDMS nanopattern stamp (600 nm period) was superimposed on the TiO$_2$ paste, subsequently air bubbles were removed, and the TiO$_2$ paste was dried at normal temperature for 12 hours. After being dried, the nanopattern stamp was removed, and anatase crystallinity was increased by calcining the TiO$_2$ paste at 450° C. to remove the residue and the polymer material contained in the paste. Thus, a patterned porous titanium dioxide thin film was produced.

On the patterned titanium dioxide thin film, a mixture of poly(3,4-ethylenedioxythiophene), poly(styrene sulfonate) and poly(3-hexylthiophene) was spin coated, and thus a field effect transistor was produced.

The performance of the field effect transistor thus produced was evaluated, and at this time, the field effect transistor described in Applied Physics Letters 94, 013502, 2009, was used as a comparative example.

As a result of the experiment, the field effect transistor described above exhibited a mobility that had increased by 20% as compared with the field effect transistor of Comparative Example, due to the large surface are of the mesoporous structure.

Preferred embodiments of the present invention have been described in detail in the above, but the scope of rights of the present invention is not intended to be limited thereto, and various modifications and improvements made by those having ordinary skill in the art using the basic concept of the present invention as defined in the following claims are also to be included in the scope of the present invention.

What is claimed is:

1. A method for producing a photoelectrode, the method comprising:
    forming a mesoporous inorganic oxide layer on a conductive substrate using a composition containing neutral mesoporous inorganic oxide particles;
    forming a pattern on the mesoporous inorganic oxide layer using an elastic stamp for pattern formation;
    adsorbing a dye to the mesoporous inorganic oxide layer on which the pattern is formed and
    injecting a hole transfer material into the mesoporous inorganic oxide layer in which the dye is adsorbed.

2. The method for producing a photoelectrode according to claim 1, wherein the inorganic oxide is an oxide containing a metal element selected from the group consisting of titanium (Ti), zinc (Zn), niobium (Nb), tungsten (W), zirconium (Zr), strontium (Sr), indium (In), lanthanum (La), vanadium (V), molybdenum (Mo), tin (Sn), magnesium (Mg), aluminum (Al), yttrium (Y), scandium (Sc), samarium (Sm), gallium (Ga), and combinations thereof.

3. The method for producing a photoelectrode according to claim 1, wherein the inorganic oxide particles have a particle size of 2 nm to 60 μm.

4. The method for producing a photoelectrode according to claim 1, wherein the elastic stamp for pattern formation is a stamp made of a material selected from the group consisting of polydimethylsiloxane, silicone rubber, polyethylene terephthalate, polycarbonate, polyimide, polyethylene, polymethyl methacrylate, polystyrene, polylactic-co-glycolic acid, hydrogel, and mixtures thereof.

5. The method for producing a photoelectrode according to claim 1, further comprising forming an interface adhesive layer on a conductive substrate using a composition containing a precursor of the inorganic oxide, before the process of forming a mesoporous inorganic oxide layer.

6. The method for producing a photoelectrode according to claim 1, wherein the pattern formation is carried out by forming a pattern on the mesoporous inorganic oxide layer using an elastic stamp for pattern formation, and then calcining the mesoporous inorganic oxide layer.

7. The method for producing a photoelectrode according to claim 1, wherein the injection of a hole transfer material involves a process of allowing a composition containing a monomer of an electroconductive polymer for forming a hole transfer material to penetrate into the patterned inorganic oxide layer, and then thermally polymerizing the monomer to form an electroconductive polymer for hole transfer material.

8. The method for producing a photoelectrode according to claim 1, further comprising injecting an additive containing a non-volatile ionic liquid and an ion salt, after the injection of a hole transfer material.

* * * * *